United States Patent [19]

Richards et al.

[11] Patent Number: 4,495,468
[45] Date of Patent: Jan. 22, 1985

[54] CONTROLLED PHASE OFF-SET DIGITAL TEST SYSTEM

[75] Inventors: Edward W. Richards, Fitchburg; Paul T. Chang, Chelmsford, both of Mass.

[73] Assignee: Tau-Tron, Inc., Chelmsford, Mass.

[21] Appl. No.: 221,988

[22] Filed: Jan. 2, 1981

[51] Int. Cl.³ .......................... H03L 7/00; H03K 5/26
[52] U.S. Cl. ...................................... 328/155; 328/55; 328/63; 328/134; 375/118
[58] Field of Search .................. 307/511, 516, 269; 328/55, 155, 63; 375/118

[56] References Cited

U.S. PATENT DOCUMENTS

| | | | |
|---|---|---|---|
| 3,293,559 | 12/1966 | Howard et al. | 307/511 |
| 4,095,186 | 6/1978 | Vesel | 328/155 |
| 4,216,544 | 8/1980 | Boleda et al. | 328/55 |
| 4,290,022 | 9/1981 | Puckette | 328/55 |

Primary Examiner—John S. Heyman
Attorney, Agent, or Firm—Robert T. Dunn

[57] ABSTRACT

In the testing of a digital test system (e.g. the automatic testing of a digital integrated semiconductor circuit) it is necessary to provide a plurality of clock signals (periodic pulse signals), each with a definite phase relationship to a particular clock signal called the "reference". For example, when the clock signals are all in the same phase they define a common wavefront without skew. The present invention produces a clock output signal that is offset in phase with respect to the reference according to a phase offset control signal by feeding the clock input to a voltage controlled variable phase shifter, comparing the shifted clock output signal with the reference to produce an output representative of the phase difference that is fed to a negative feedback circuit that controls the variable phase shifter and means are provided in the feedback circuit for modifying the feedback according to the offset control signal so that the clock output phase offset is proportional to the offset control signal when the system is in equilibrium.

13 Claims, 13 Drawing Figures

DRIFT COMPENSATION
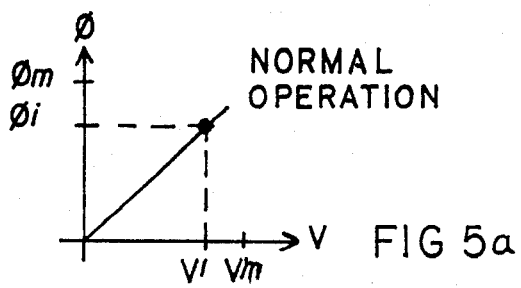
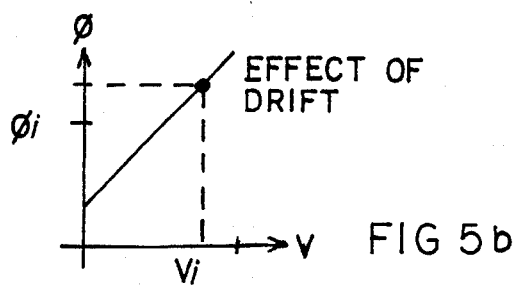
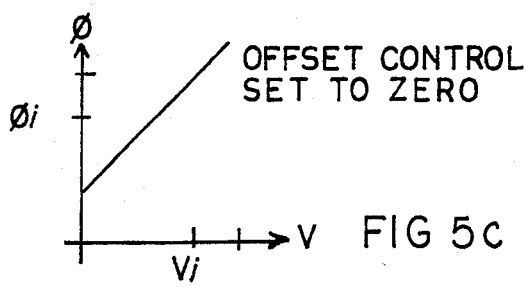
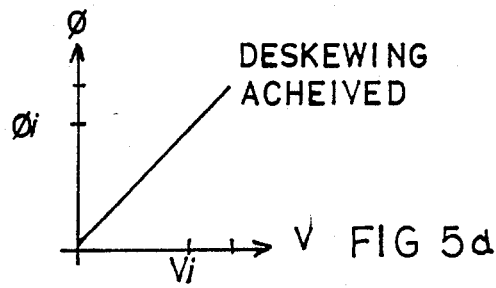
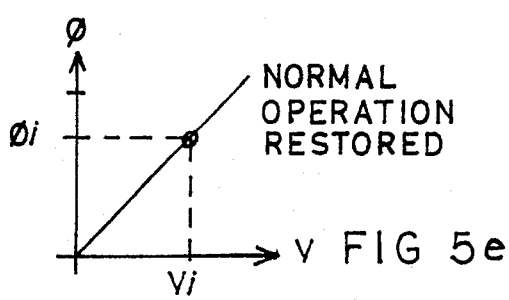
CHANGE OF PHASE RANGE
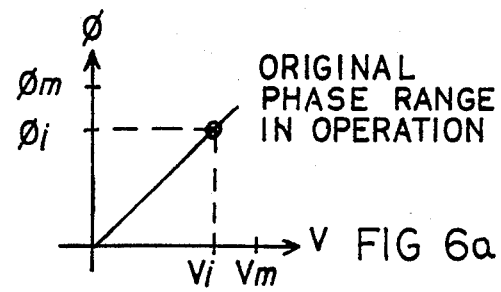
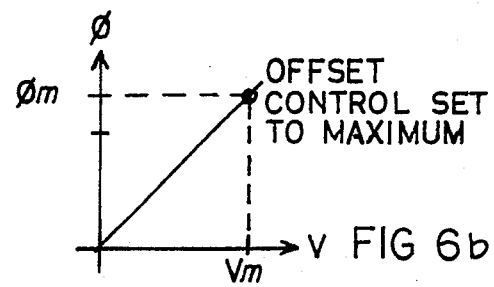
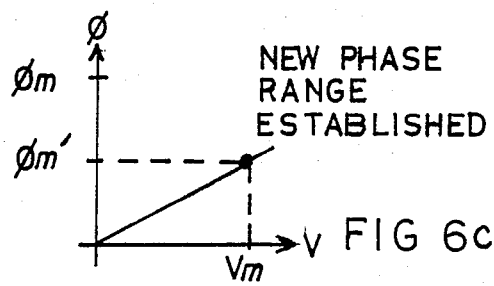
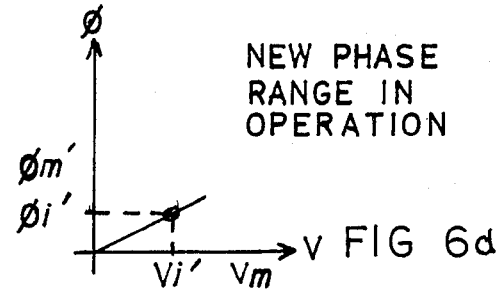

CONTROLLED PHASE OFF-SET DIGITAL TEST SYSTEM

BACKGROUND OF THE INVENTION

The present invention relates to digital test systems where the phase of a test signal is directly created by a variable clock output under control of an externally programmed input with respect to a reference signal and more particularly to a digital test system producing clock test signals in a plurality of channels, each controlled in phase with respect to a reference signal.

Digital test systems used for testing integrated circuits provide in a plurality of channel clock test signals to be applied to a plurality of points in the integrated circuit under test and it is important that each channel test signal be in a predetermined controlled phase relative to a reference clock signal. For example, when all the clock test signals are in phase with the reference, it is said that they have a common wave front without skew. The procedure followed to correct or eliminate skew is referred to as deskewing, inasmuch as any skew or tilt of the common wave front is corrected by the deskewing process. Heretofor, deskewing has required tedious hours of cable trimming and matching to bring all of the channel test signals into phase synchronism with the reference at the points where they are applied to the circuit under test. Furthermore, even after the channel test signals are deskewed, slight changes in circuit parameters that occur due to changing ambient conditions, and generally referred to as drift, will cause skewing to occur and, unless the drift is copensated for by deskewing, it will cause errors and decrease the reliability of the testing. It is one object of the present invention to provide a test system wherein deskewing can be accomplished relatively easily, as often as desired, even while the test system is in use testing an integrated circuit.

Once the test circuit is deskewed, it will provide a common wave front across the channel test signals to all inputs of the integrated circuit under test. In other words, the leading edges of all pulses from channel to channel at the points where they are applied to the integrated circuit under test will define a common wave front without any skew.

In order to provide a test system with a wide dynamic range, it is desireable to provide a wave front of clock test signals that has a predetermined controlled skew that can be varied readily with respect to the reference. Clearly, this requires that each clock test signal be controlled in phase and compared to the reference. Furthermore, it is desireable to be able to change the skew of each clock test signal relative to the reference readily according to calibrated phase offset control signals and also to change the calibration from time to time. It is another object of the present invention to provide a test system with the capacity of controlling the skew of such clock test signals according to clock offset phase control signals and for varying the calibration of the offset control signal versus the phase offset of the corresponding clock signal over a relatively wide dynamic range.

It is another object of the present invention to provide a method of deskewing clock test signals automatically without resorting to cable trimming, matching etc.

It is another object to provide a method of controlling the skew of a clock signal with respect to a reference signal according to a phase offset control signal and for varying the calibration of the phase offset signal versus the phase offset of the clock relative to the reference.

According to a principle feature of the present invention, the phase offset of a clock test signal with respect to the reference signal is accomplished using a closed loop feedback circuit including a voltage controlled variable phase shifter for shifting phase of the clock signal, a phase comparator for comparing the shifted clock signal with the reference signal producing an output representative of the phase difference, a negatlve feedback circuit between the comparator output and the voltage control of the phase shifter and means in the feedback circuit for multiplying the comparator output feedback signal by the clock phase offset control signal, so that the clock phase offset is proportional to the offset control signal when the feedback system is in equilibrium. A preferred embodiment of the present invention includes the above described phase offset control with another feedback circuit and appropriate switching means for deskewing and for setting and changing the calibration of clock phase offset control versus the clock phase offset.

These and other objects and features of the present invention will be apparent from the following specific description of embodiments of the present invention taken in conjunction with the drawings.

DESCRIPTION OF THE DRAWINGS

FIGS. 5, *a* to *e* are phase versus voltage diagrams that aid in explaining the deskewing technique; and FIGS. 6, *a* to *d* are voltage versus phase diagrams to aid and explain the calibration of a clock phase offset control signal versus the clock signal phase offset.

DESCRIPTION OF EMBODIMENTS OF THE INVENTION

General

In the testing of a digital system (e.g. the automatic testing of a digital integrated semiconductor circuit) it is necessary to provide a plurality of clock test signals (periodic pulse signals), each with a definite phase relationship to a particular clock signal called the reference. It is desireable that these phases be controllable so that, from test to test, they can be changed as desired. It is also desirable that these phases not change or drift due to environmental factors such as temperature, supply voltage, and age.

Heretofore the initial phase alignments required many tedious hours of cable trimming. Subsequent re-alignments to compensate for drift involved the same tedious procedures and relied on human judgement for proper realignment. As mentioned, one of the objects of the present invention is to automate the alignment and realignment procedures, whereby the mere application of a command signal automatically establishes the relative clock phases without involving human judgement.

Heretofore control of the relative clock signal phases required choice between large phase range and high resolution. The choice could be avoided only by providing the largest phase range with the highest resolution, requiring extreme accuracy and attendant high cost. It is a further objective of the present invention to provide a programable tradeoff between phase range and resolution in which the resolution is a fixed percentage of the total range, independent of the size of that range. This scheme requires only moderate accuracy.

The circuit embodying the proposed objectives is called a phase elastic storage circuit. This circuit achieves the alignment and periodic realignemnt of the various clock test signal phases (relative to the reference) in two steps. First all clock test signals are automatically aligned to have the same phase as the reference. Then calibrated clock phase "offsets" are introduced into each clock test signal channel as desired. At some later time the offsets can be removed and the phases compared. In general it will be found that they are no longer the same as the reference due to drift. This condition is called "skewing" of the clock phases. The phase elastic storage can automatically re-establish the clock phases, compensating for drift, at the command of a control signal. This process is called "deskewing". The calibrated phase offsets for each channel can then be re-introduced and the circuit restored to service. The sizes of the offsets can vary from test to test.

Deskewing

Figure 1:
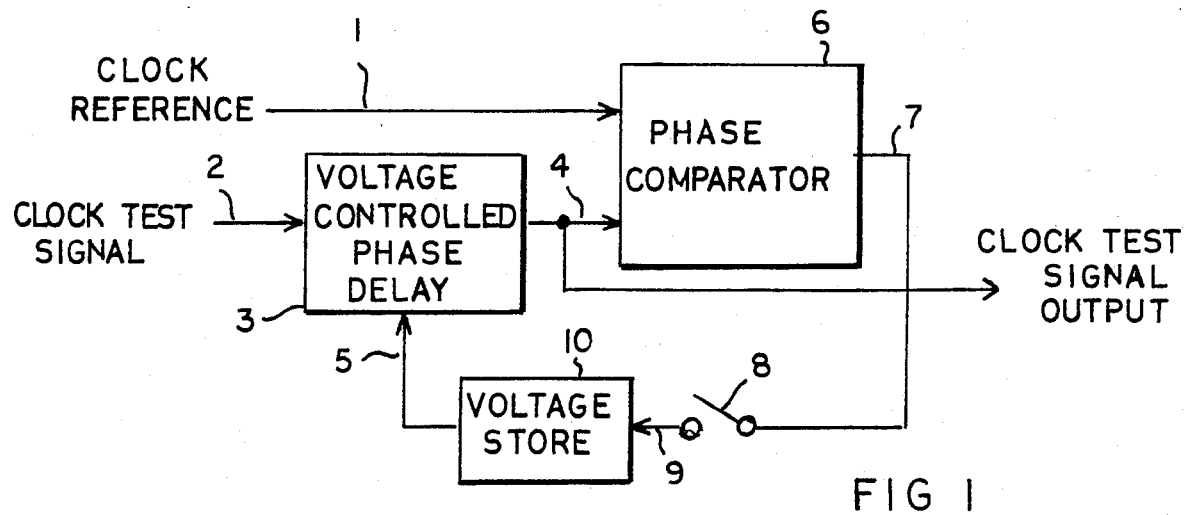
FIG. 1 is a block diagram illustrating the method and means of deskewing a clock test signal with respect to a reference signal.

The method whereby the phase elastic storage achieves deskewing is illustrated in FIG. 1. The case of one clock signal is considered. A simple extension to a plurality of clock signals is also described. The clock input signal at 2 is delayed by a voltage-controlled phase delay (VCPD) 3. The phase of the delayed clock output signal at 4 is compared with the phase of the reference at 1 by a phase comparator 6. The phase comparator output at 7 is positive when the clock test output leads the reference and negative when it lags the reference. The phase of the delayed clock output at 4 remains unchanged except for drift while switch 8 is open. On the other hand when switch 8 is closed, the output at 7 of the phase comparator is connected to the input 9 of the voltage store 10. When 9 is positive, the voltage stored in 10 increases. When 9 is negative, the voltage stored in 10 decreases. The output 5 of the voltage store is the control voltage to VCPD 3, causing the phase at 4 to increase or decrease as 5 increases or decreases, respectively. In this manner negative feedback always returns the phase at 4 to the phase of the reference at 1 when switch 8 is closed. While switch 8 is open, drift can cause skewing between the clock output and reference signal. When switch 8 is closed deskewing is achieved.

Offset Control and Calibration

Figure 2:
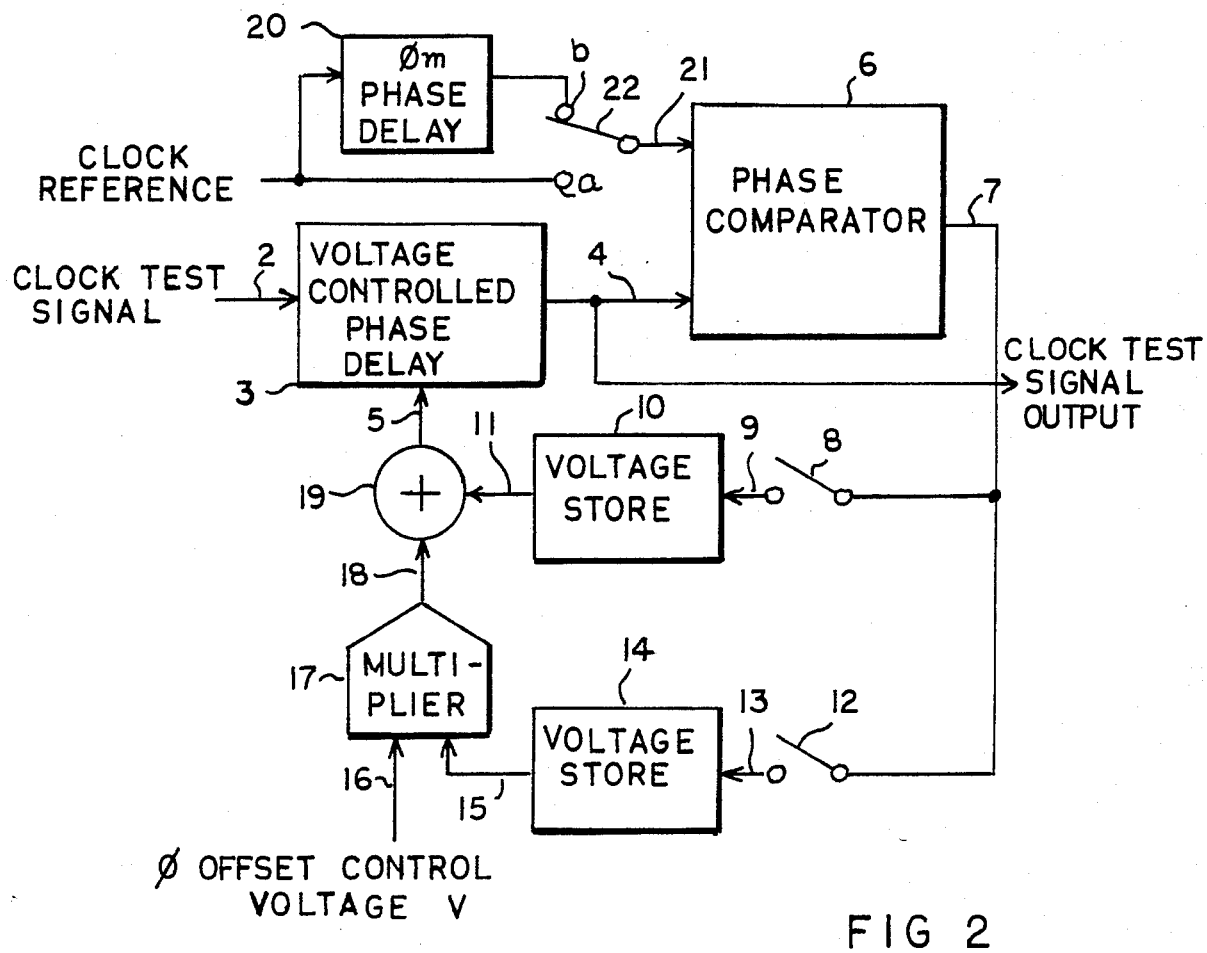
FIG. 2 is a block diagram illustrating the method and means of deskewing, controlling the skew of a clock signal with respect to a reference signal and varying the calibration of the clock phase offset control signal versus the clock skew.

This technique, referred to herein as phase elastic storage is illustrated by FIG. 2 for a single channel. FIG. 2 also incorporates the deskewing technique shown in FIG. 1. It is assumed that switch 8 has been recently closed and then opened, achieving deskewing while the phase $\phi$ offset control signal at 16 was zero (minimum) and switch 22 was in Position A. Throughout the remainder of the operation, switch 8 must remain open. First the maximum phase range $\phi m$ is established by introducing delay 20 into the reference path. This is done by setting switch 22 in position B so that the delayed reference at 21 is applied to the phase comparator 6. The offset control at 16 is set to its maximum desired value. Then switch 12 is closed, causing the shifted clock output at 4 to attain the same phase as the delayed reference at 21 by negative feedback. The loop operation is the same as in deskewing except that a multiplier 17 with one fixed input at 16 and a summation circuit 19 have been introduced into the loop. Once switch 12 is opened, the phase of the clock output signal at 4 is free to vary in response to $\phi$ offset control at 16.

By the technique demonstrated in FIG. 2, two end points have been fixed. Zero offset control corresponds to zero phase between the clock output at 4 and the reference at 1, and maximum offset control at 16 corresponds to the delay $\phi m$ 20 between the clock output and reference signals. This is illustrated in FIG. 5a, where the maximum offset voltage is $V_m$ and the delay phase range is $\phi m$. An intermediate value of the offset voltage $V_i$ between the clock output and reference signals. It is usually desirable that this be a linear relationship.

The effects of drift and corrective deskewing for both FIGS. 1 and 2 are illustrated in terms of the changes in FIG. 5a. During normal operation, as in FIG. 5a, switches 8 and 12 are open. Offset control $V_i$ causes the desired delayed clock output phase $\phi_i$. After drift occurs, $V_i$ no longer causes $\phi_i$, as illustrated in FIG. 5b. The first step in compensating for the drift is to set the offset control to zero, as in FIG. 5c. In FIG. 2 switch 22 is set in position A, and switch 8 is closed, causing the phase of the clock output signal at 4 relative to the reference at 1 to go to zero (see FIG. 5d). Then switch 8 is opened, and offset control 16 is set to $V_i$ again, returning the circuit to normal operation.

The sequence to change offset range and resolution is illustrated in terms of changes in FIG. 5a (reproduced in FIG. 6a). When the circuit is in operation, switches 8 and 12 are open, and the offset control at 16 is set at some value $V_i$. The first step is to set the offset control to its new maximum $V_m$ as shown in FIG. 6b. The delayed reference 20 is applied as a new value that corresponds to the new $\phi m'$ and switch 22 is set at the B position. Then, when switch 12 is closed the phase difference between the clock-output at 4 and the reference signal at 21 goes to zero as the feedback system is driven to equilibrium. This extablishes the new clock output - phase offset range $\phi m'$. This sequence is illustrated by FIGS. 6a to 6d. Circuit operation is again established with the new calibration by opening switch 12 and setting the phase offset control to a desired value $V_i'$.

The new phase range may be capable of higher phase resolution than the previous set.

Figure 3:
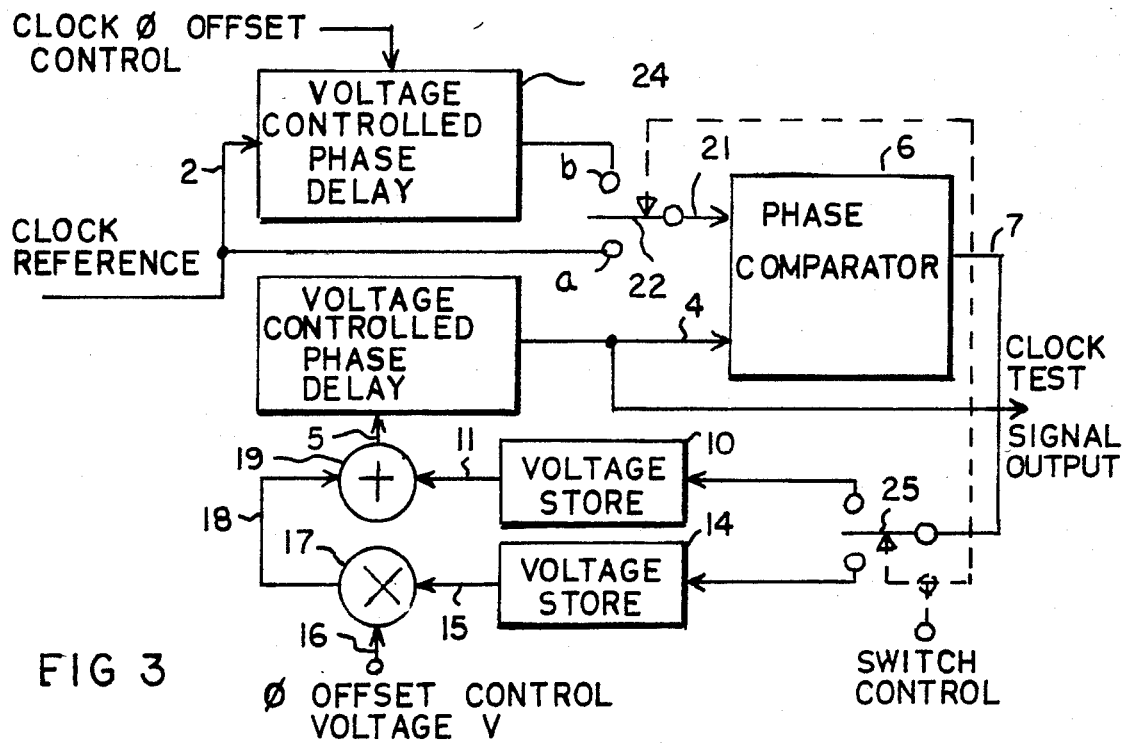
FIG. 3 is a block diagram illustrating another method and means of doing the same thing as illustrated by FIG. 2.

Another embodiment is illustrated in FIG. 3. Here, the $\phi m$ delay of the reference is made a variable so that in the calibration of V versus $\phi$, $\phi m$ can be varied as well as Vm. Also, in this embodiment, there is a slightly different arrangement of the switches, but otherwise the technique is identical to that illustrated by FIG. 2. Here, a voltage controlled $\phi m$ delay 24 is substituted for $\phi m$ delay 20 of FIG. 2 and a single momentary closure, double throw switch 25 replaces switches 8 and 12 and it is ganged with double throw switch 22.

Where the test system produces several variable clock output signals in seperate channels that are delivered at the same time to a circuit under test, there must be a VCPD and a feedback circuit for each channel. However, there need be only one phase comparator circuit, because those functions are performed only periodically to deskew and/or to calibrate the maximum range of each clock signal. Those functions are performed periodically, very quickly, successively for the channels under the control of several commutator-type switches. A system such as this is shown in FIG. 4.

Figure 4:
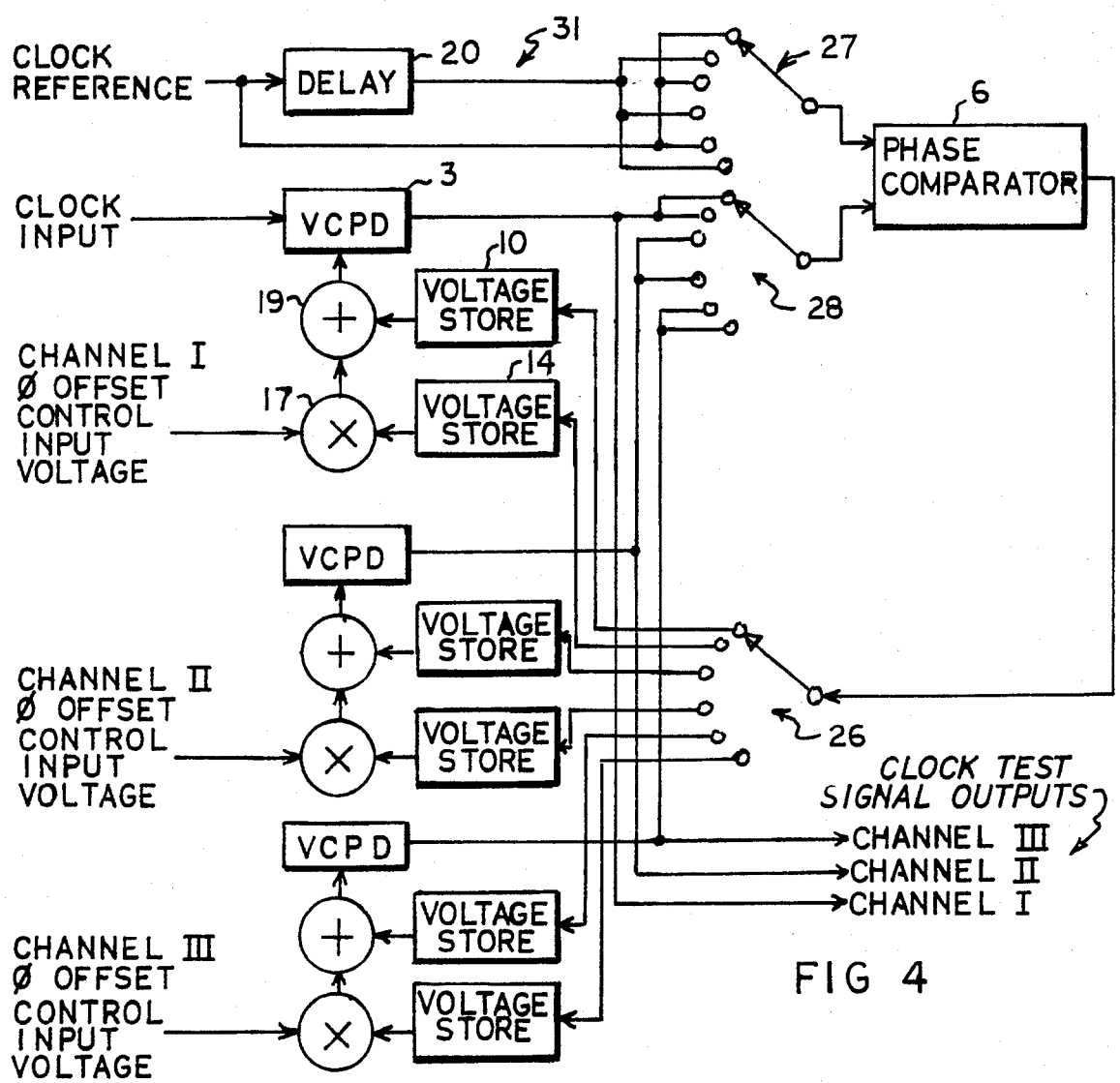
FIG. 4 is a block diagram illustrating the method and means of FIGS. 2 and 3 with switching for deskewing, controlling the skew and calibrating several channel clock test signals, all with respect to a reference signal.

As shown in FIG. 4, each of the channels I, II and III inlcudes a VCPD 3 for the clock output signal, storage 10 for deskew compensate voltage, storage 14 for the maximum offset phase $\phi m$ range compensate, a multiplier circuit 17 for multiplying Fm by the offset control signal Vi and a summation circuit 19 for adding the stored feedback voltages. Only one phase comparator circuit 6 and one reference circuit 31 are provided. All switching for the deskewing and calibration is done by three ganged commutator-type switches 26, 27 and 28. Otherwise operation of each of the channels I, II and III in this system is the same as in FIG. 2.

The embodiments of the present invention described herein, represent the best known use of the invention and incorporate all of the features of the invention. It is to be clearly understood, however, that some of these features can be employed independently of the others to gain at least some of the advantages of the invention. Furthermore, certain minor changes could be made and other combinations of the features could be ued without departing form the spirit and scope of the invention set forth in the appended claims.

We claim:

1. A system for producing a clock output signal that is offset in phase with respect to a reference signal according to a clock phase offset control signal comprising;
   (a) sources of clock and reference signals and clock offset control signal,
   (b) a controlled variable phase shifter for shifting phase of the clock signal, producing a clock output signal,
   (c) a phase comparator for comparing the phase shifted clock output signal with the reference signal producing a comparator output signal representative of the phase difference,
   (d) a negative feedback circuit between the comparator output and the variable phase shift control and
   (e) means in said feedback circuit for multiplying feedback to the phase shifter by the off-set control signal,
   (f) whereby the clock output phase offset is proportional to the offset control signal when the system is in equilibrium.

2. A system as in claim 1 wherein the feedback circuit includes,
   (a) signal level storage means for storing the comparator output signal level,
   (b) the multiplyer circuit for multiplying the stored signal level by the offset control signal and
   (c) means for coupling the multiplier output to the phase shifter control.

3. A system as in claim 2 wherein
   (a) means are provided for shifting phase of the reference signal a maximum shift that corresponds to the maximum offset control signal and
   (b) control switching means are provided in the system so that the reference signal is phase shifted said maximum shift when the comparator output is coupled to the storing means and the reference signal is not phase shifted when the comparator output is not coupled to the storing means.

4. A system as in claim 3 wherein the storing means stores the voltage level of the comparator output when the switching means is activated.

5. A system as in claim 3 wherein
   (a) other storage means is provided for storing the comparator output signal level when the reference signal is not phase shifted and
   (b) other means is provided for coupling the output thereof to the variable phase shifter control.

6. A system as in claim 5 wherein means are provided for combining the multiplier output and the other storage output and applying the combination to the variable phase shifter control.

7. A system as in claim 6 wherein the switching means includes a switch between the comparator output and the first mentioned and other storing means and a switch between the reference signal input to the comparator and the reference signal with maximum shift and with no shift.

8. A system as in claim 7 wherein means are provided for operating said switching means in unison.

9. A system as in claim 8 wherein means are provided for varying the offset control signal to thereby vary the clock output signal phase offset when the comparator output is not coupled to either storing means.

10. A method of producing a clock output signal that is offset in phase according to an offset control signal with respect to a reference signal comprising the steps of:
    (a) shifting the phase of the clock signal,
    (b) comparing the phase of the phase shifted clock signal with the phase of the reference signal to produce a comparison output signal representative of the difference in phase,
    (c) multiplying said output signal by the offset control signal producing a modified comparison output signal and
    (d) controlling said clock signal phase shifting with said modified output signal,
    (e) whereby the clock output signal is offset in phase with respect to the reference signal according to the offset control signal.

11. The method as in claim 10 including the step of deskewing by:
    (a) storing the comparison output signal from the comparing step, while the offset control signal is at zero value and the shift in phase of the reference signal is zero and
    (b) controlling the clock signal shifting with the said stored signal.

12. The method as in claim 10 including the steps of:
    (a) shifting the phase of the reference signal a maximum shift that corresponds to the maximum offset control signal before comparing with the phase shifted clock output signal and
    (b) storing the output signal from the comparing step.

13. The method as in claim 12 wherein:
    (a) the reference signal is shifted in phase a maximum shift while the offset control signal is set at its maximum
    (b) the comparing output is stored,
    (c) the stored signal is multiplied by the maximum offset control signal and
    (d) the product thereof is applied to control the shifting of the phase of the clock signal.

* * * * *